United States Patent [19]

Brennian, Jr. et al.

[11] Patent Number: 5,297,966
[45] Date of Patent: Mar. 29, 1994

[54] MOUNTING BRACKET FOR AN ELECTRICAL CONNECTOR

[75] Inventors: Ronald W. Brennian, Jr., Columbia; Robert S. Correll, Jr., Harrisburg; Jon A. Fortuna, Mechanicsburg, all of Pa.

[73] Assignee: The Whitaker Corporation, Wilmington, Del.

[21] Appl. No.: 987,225

[22] Filed: Dec. 8, 1992

Related U.S. Application Data

[63] Continuation-in-part of Ser. No. 926,628, Aug. 10, 1992.

[51] Int. Cl.$^5$ .............................................. H01R 9/09
[52] U.S. Cl. ...................................... 439/64; 439/570; 439/377
[58] Field of Search ................. 439/62, 64, 83, 317, 439/329, 567, 325, 570, 540, 571, 572

[56] References Cited

U.S. PATENT DOCUMENTS

| | | | |
|---|---|---|---|
| 3,775,643 | 11/1973 | Schachnow et al. | |
| 3,932,016 | 1/1976 | Ammenheuser | |
| 4,046,443 | 9/1977 | Champagne | |
| 4,668,040 | 5/1987 | Matsuzaki et al. | 439/567 X |
| 4,861,277 | 8/1989 | Bina | 438/377 X |
| 4,941,841 | 7/1990 | Darden et al. | 439/377 X |
| 5,145,407 | 9/1992 | Obata et al. | 439/571 X |
| 5,176,523 | 1/1993 | Lai | 439/64 |
| 5,186,654 | 2/1993 | Enomoto et al. | 439/570 |
| 5,201,662 | 4/1993 | Roche | 439/377 X |

OTHER PUBLICATIONS

IBM Technical Disclosure Bulletin, vol. 30, No. 6, Nov. 1987.
Memory/PC Card Connector (Compatible with PCMCIA, Release 2.0; AMP Incorporated; Dec. 1991.
PC Card Standard, Release 2.0, Personal Computer Memory Card International Association (PCMCIA); Sep. 1991.

Primary Examiner—Larry I. Schwartz
Assistant Examiner—Khiem Nguyen

[57] ABSTRACT

An electrical connector (1) comprises; a housing (2), a card receiving mouth (3), electrical contacts (4), prong receiving sockets (26) on the housing (2) card guide arms (5, 6), a prong (25) on each of the guide arms (5, 6) for locking engagement with any one of the sockets (26), and each of the sockets (26) lockingly engage one of the guide arms (5, 6) only with a card receiving groove (22) of one guide arm (5, 6) being oriented to face toward another guide arm (5, 6).

11 Claims, 10 Drawing Sheets

MOUNTING BRACKET FOR AN ELECTRICAL CONNECTOR

CROSS REFERENCE TO RELATED APPLICATION

This application is a continuation-in-part of application Ser. No. 07/926,628 filed Aug. 10, 1992.

FIELD OF THE INVENTION

The invention relates to a mounting bracket for an electrical connector for a card reader, and more particularly, to a mounting bracket for an electrical connector having guide arms for guiding a card into the connector.

BACKGROUND OF THE INVENTION

A known electrical connector, disclosed in U.S. Pat. No. 4,952,161, comprises, a card connector having card guide grooves for guiding two cards in an overlapping manner. It would be desirable to adapt such a card connector for mounting to either one of a first circuit board or a second, inverted circuit board.

SUMMARY OF THE INVENTION

The present invention resides in an electrical connector for a card reader, comprising, a card receiving housing and a set of card guide arms constructed with card receiving grooves for guiding edges of a card to be received in a mouth of the housing. The connector is adapted for mounting to a circuit board by a mounting bracket for solder connection to a circuit board. The mounting bracket is constructed for assembly in selected channels in the housing and in the guide arms. Each of the channels is constructed to receive the solder connection of the bracket in an inverted position or in a noninverted position and to be held by the bracket against a circuit board to which the bracket is connected by solder.

DESCRIPTION OF THE DRAWINGS

Embodiments of the invention will now be described by way of example with reference to the accompanying drawings in which.

DETAILED DESCRIPTION

Figure 1:
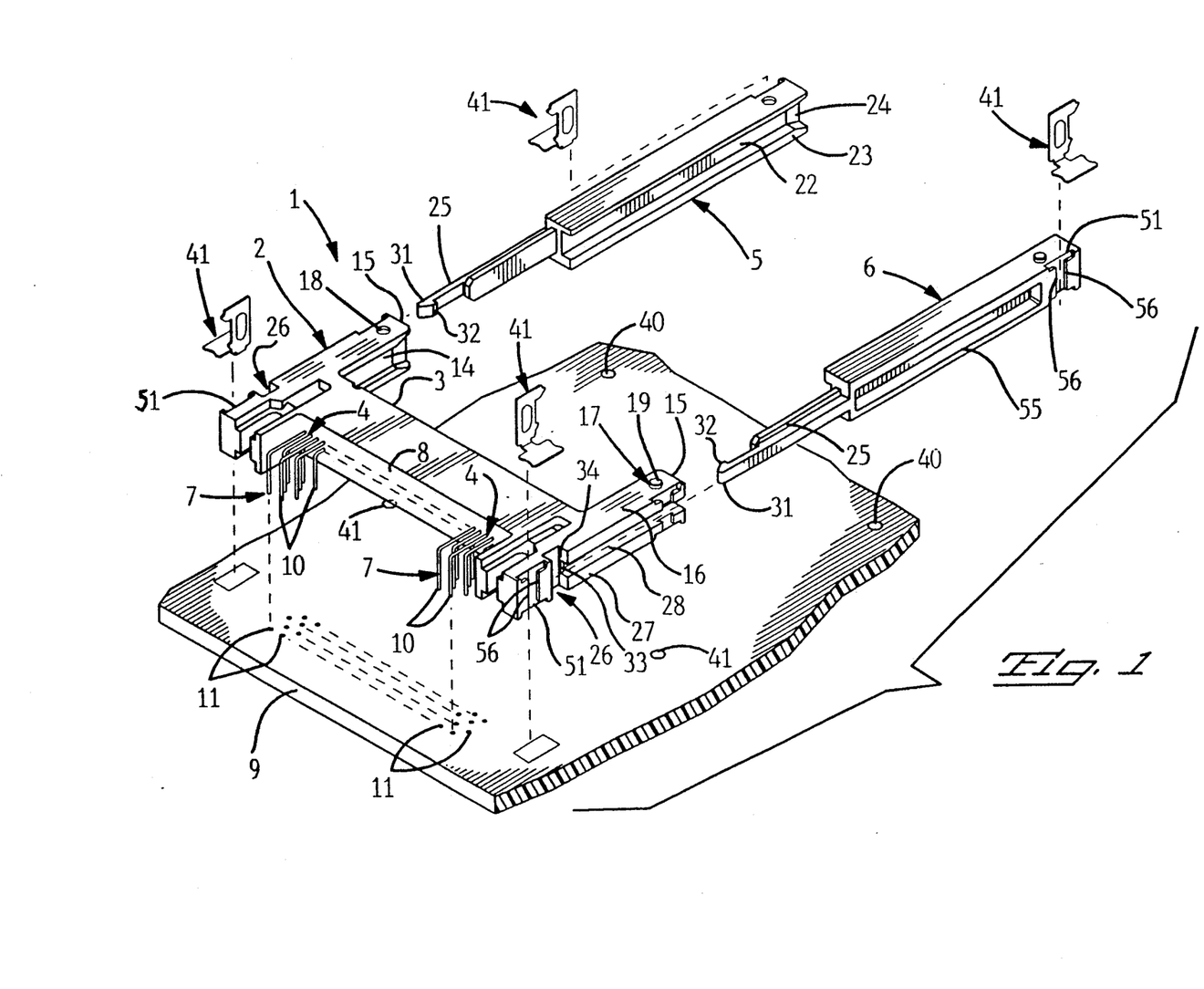
FIG. 1 is a perspective view of an electrical connector having a housing and a set of card guide arms for a single card, together with mounting brackets and a circuit board.
Figure 2:
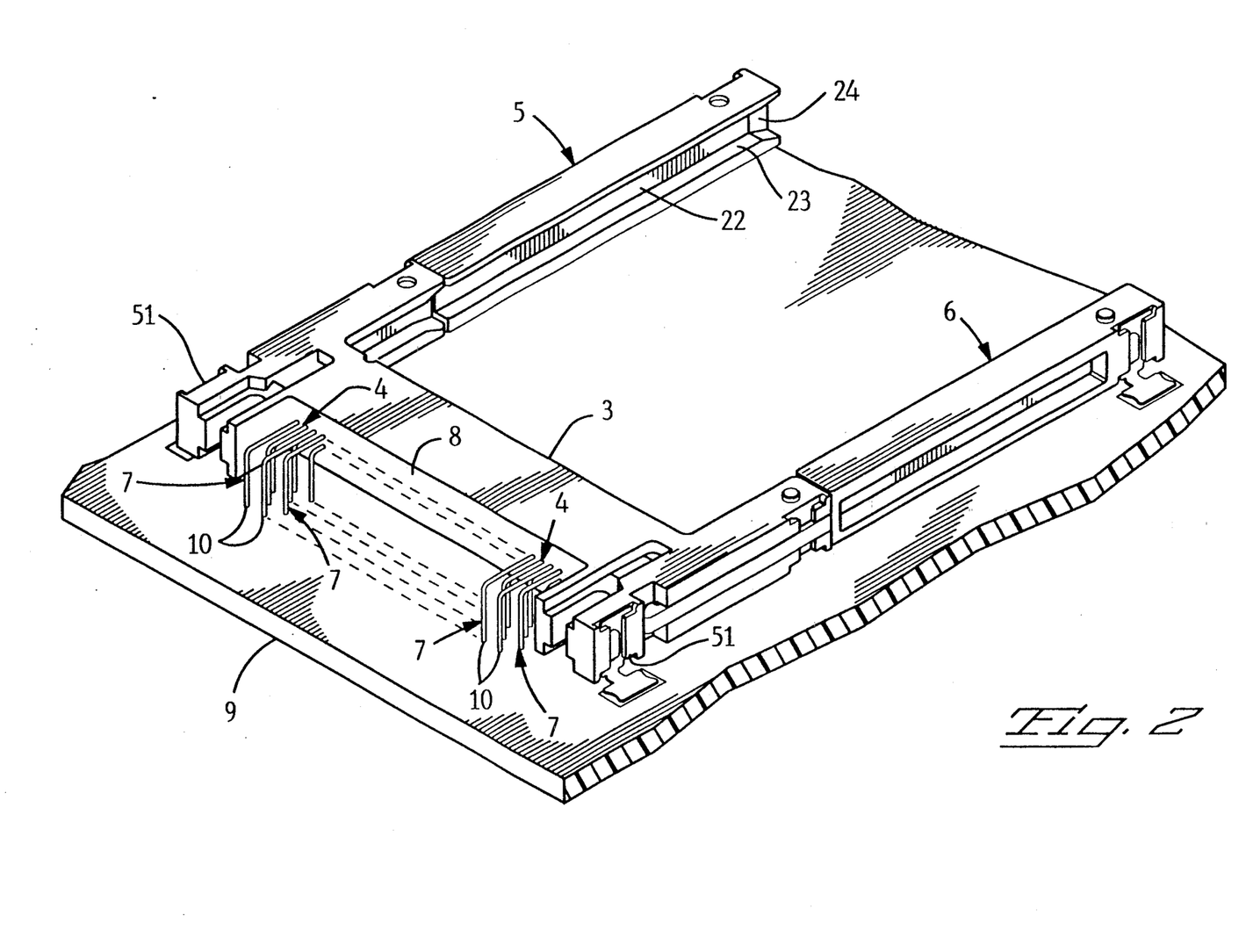
FIG. 2 is a perspective view of an assemblage of the devices shown in FIG. 1.

With reference to FIG. 1, an electrical connector 1, especially suitable for use in a card reader, not shown, includes an insulating housing 2 having a card receiving mouth 3, FIG. 2, multiple electrical contacts 4 held by the housing 2 extending in two rows and into the mouth 3, and a set of card guide arms 5, 6. Tail sections 7 of the contacts 4 extend outwardly of a rear surface 8 of the housing 2 for connection to a first circuit board 9 shown in phantom outline. Feet 10 on free ends of the contacts 4 are adapted with respective shapes for connection to the circuit board 9. For example, the feet 10 are shaped as posts for insertion into plated apertures 11 of the circuit board 9. Alternatively, the feet 10 can be shaped as surface mount flat portions, not shown, for connection to surface mount pads on the circuit board 9, FIGS. 1, 2, 8, 14 and 16.

Figure 14:
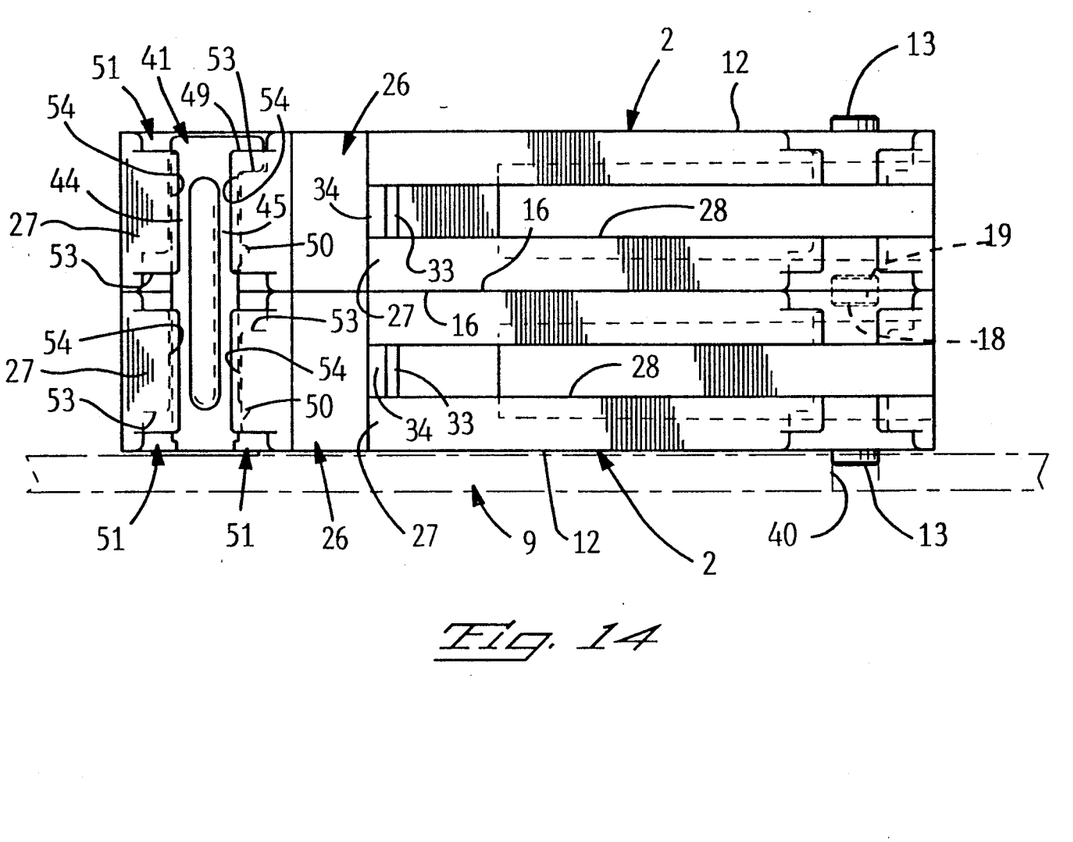
FIG. 14 is a fragmentary enlarged view of the housing of FIG. 1 stacked together with a duplicate housing, and a mounting bracket mounted to a circuit board.
Figure 16:
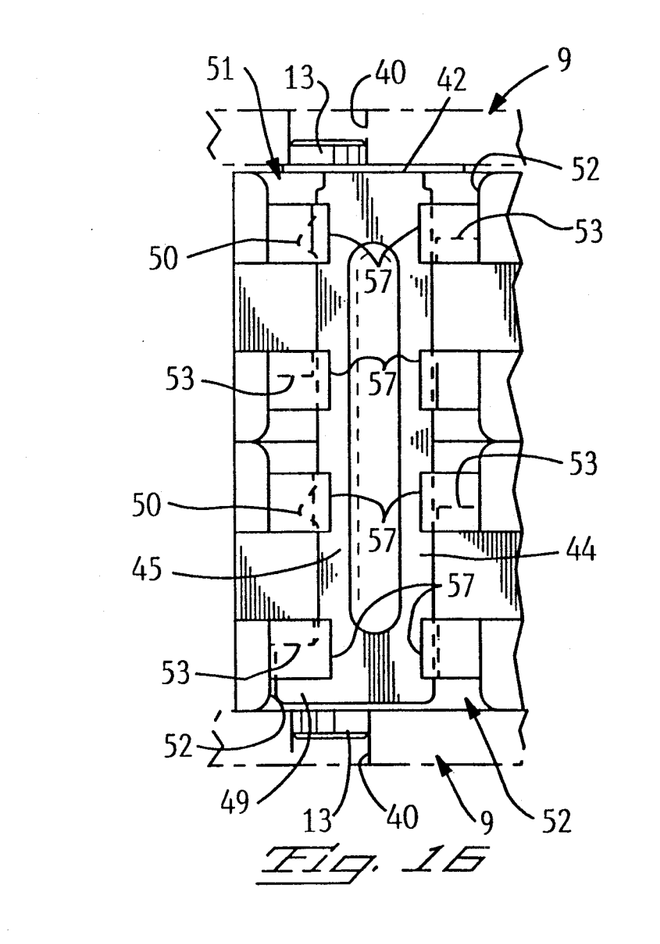
FIG. 16 is an enlarged fragmentary view of the stacked housings and an inverted mounting bracket mounted to a second circuit board.

With reference to FIGS. 14 and 16, the connector 1 is accompanied by a duplicate housing 2, inverted, accompanied by another set of inverted guide arms 5,6, not shown. A bottom surface 12 is on each housing 2 with a projecting knob or foot 13, received in an alignment aperture 40 in the circuit board 9. Each housing 2 has starter grooves 14 in forwardly projecting housing arms 15 on opposite sides of the mouth 3. A top surface 16 of each housing 2 has a locking structure 17 in the form of a recess 18 on one side flanking the mouth 3, and a projecting knob 19 in another side flanking the mouth 3. The duplicate housings 2 can be stacked and interlocked, FIGS. 14 and 16, when inverted with respect to each other, with the recess 18 of each housing receiving the knob 19 of the other housing.

Each housing 2 is constructed for use alone on the circuit board 9, FIGS. 1 and 2, or for interlocking with a duplicate housing 2, FIGS. 14 and 16. The card receiving mouth 3 is defined either by a single housing 2 or by two housings 2. The card receiving mouth 3 is adapted to receive one or, alternatively, two cards, one for each of the stacked housings 2. The cards are known in the industry, and are disclosed, for example, in U.S. Pat. No. 5,033,972.

With reference to FIG. 16, the stacked housings 2 can be mounted to a second, inverted circuit board 9, as an alternative to the first circuit board 9, as shown in FIG. 1.

The guide arms 5, 6 are of unitary construction molded from a thermoplastic material. FIG. 1, card receiving grooves 22 on inside surfaces 23 extend along lengths of the respective guide arms 5, 6. Flared, groove mouths 24 at respective ends of the guide arms 5, 6 open into respective grooves 22 of the guide arms 5, 6. At opposite ends of respective guide arms 5, 6, respective elongated prongs 25 extend outwardly.

The prongs 25 lockingly engage in sockets 26, the sockets 26 being in respective, exterior side surfaces 27 of the housing 2 flanking the mouth 3. The prongs 25 have respective cross sections that interfit slidably along grooves 28 in the respective, exterior side surfaces 27 of the housing 2. Ends of the prongs 25 have respective locking latches 31 with transverse, projecting fingers 32. The fingers 32 are forced to bend resiliently as they traverse in respective grooves 28, until the fingers 32 emerge from ends 33 of the grooves 28 and unbend to register against transverse latch shoulders 34 at the ends 33 of the grooves 28. Thereby, the prongs 25 lockingly engage the sockets 26.

Figure 3:
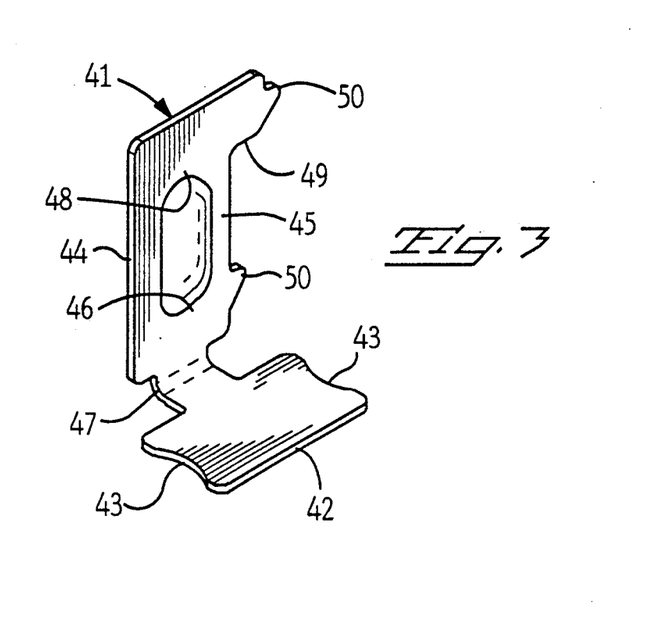
FIGS. 3, 4, 5 and 6 are perspective views of mounting brackets.
Figure 4:
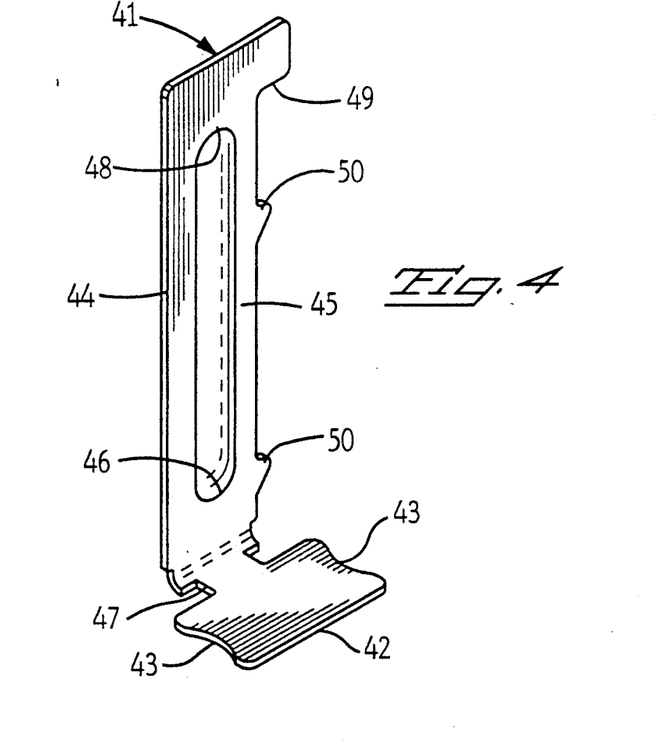
Figure 5:
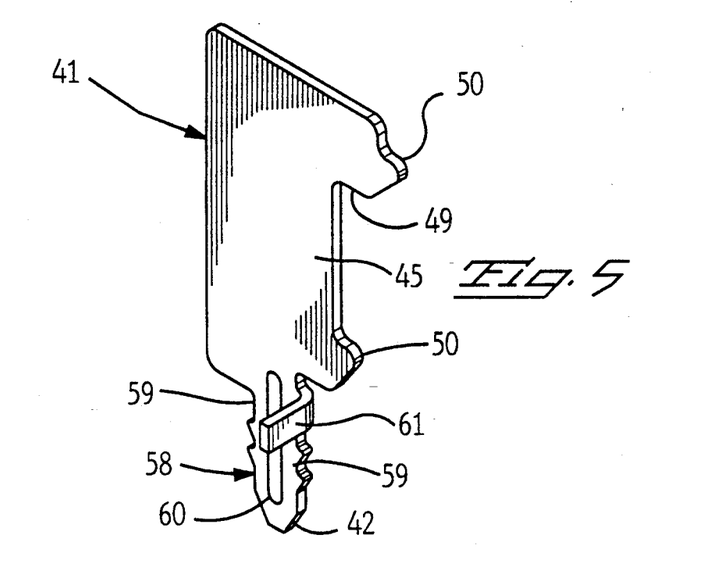
Figure 6:
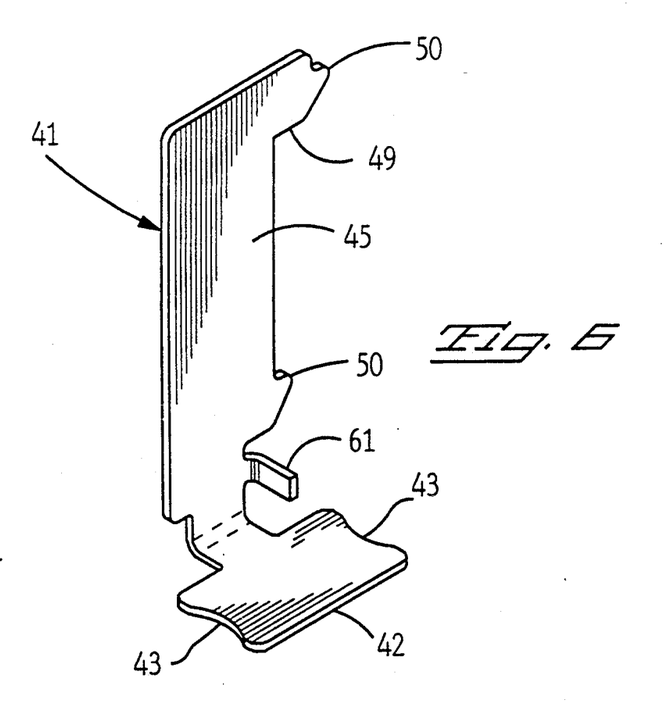
Figure 7:
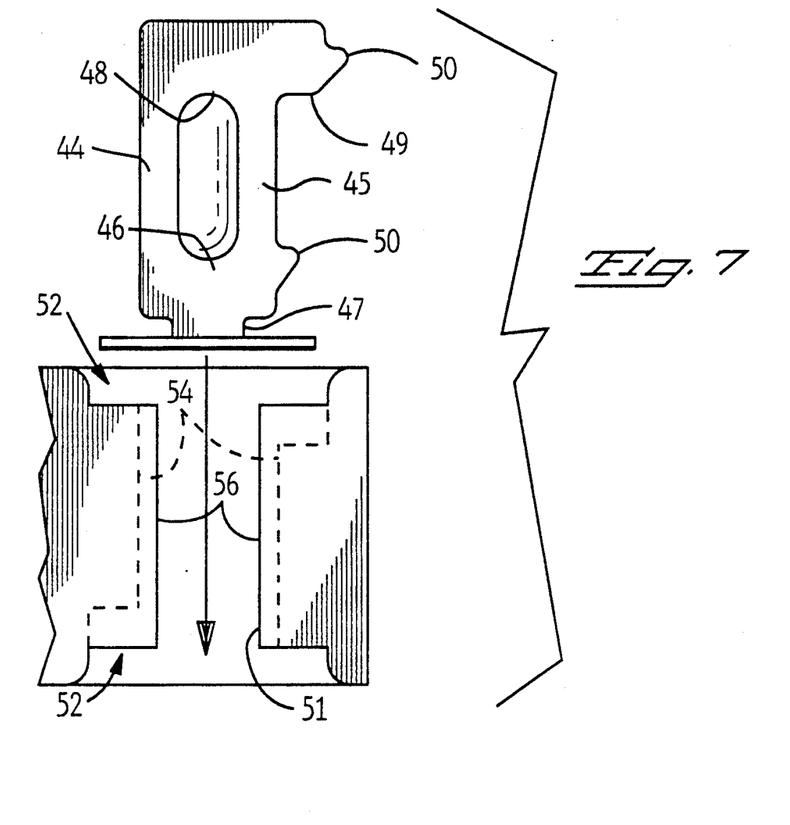
FIGS. 7 and 8 are fragmentary elevation views illustrating the mounting bracket of FIG. 3 in the process of connection with a portion of the housing shown in FIG. 1.
Figure 8:
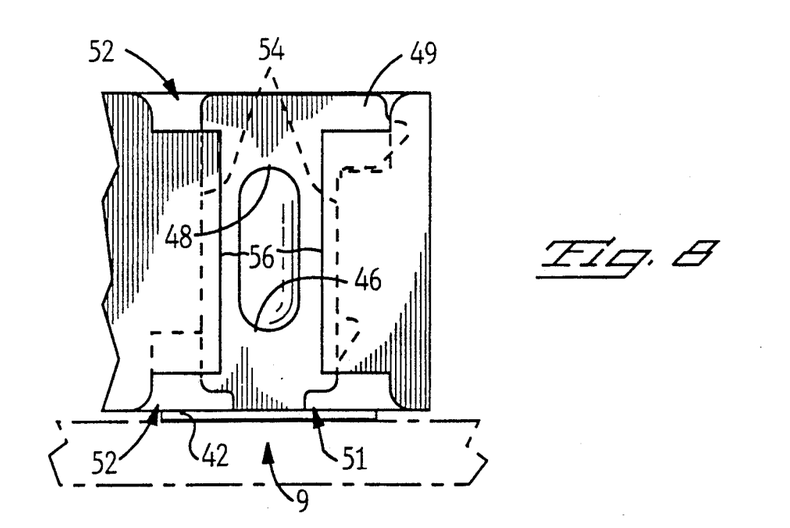
Figure 9:
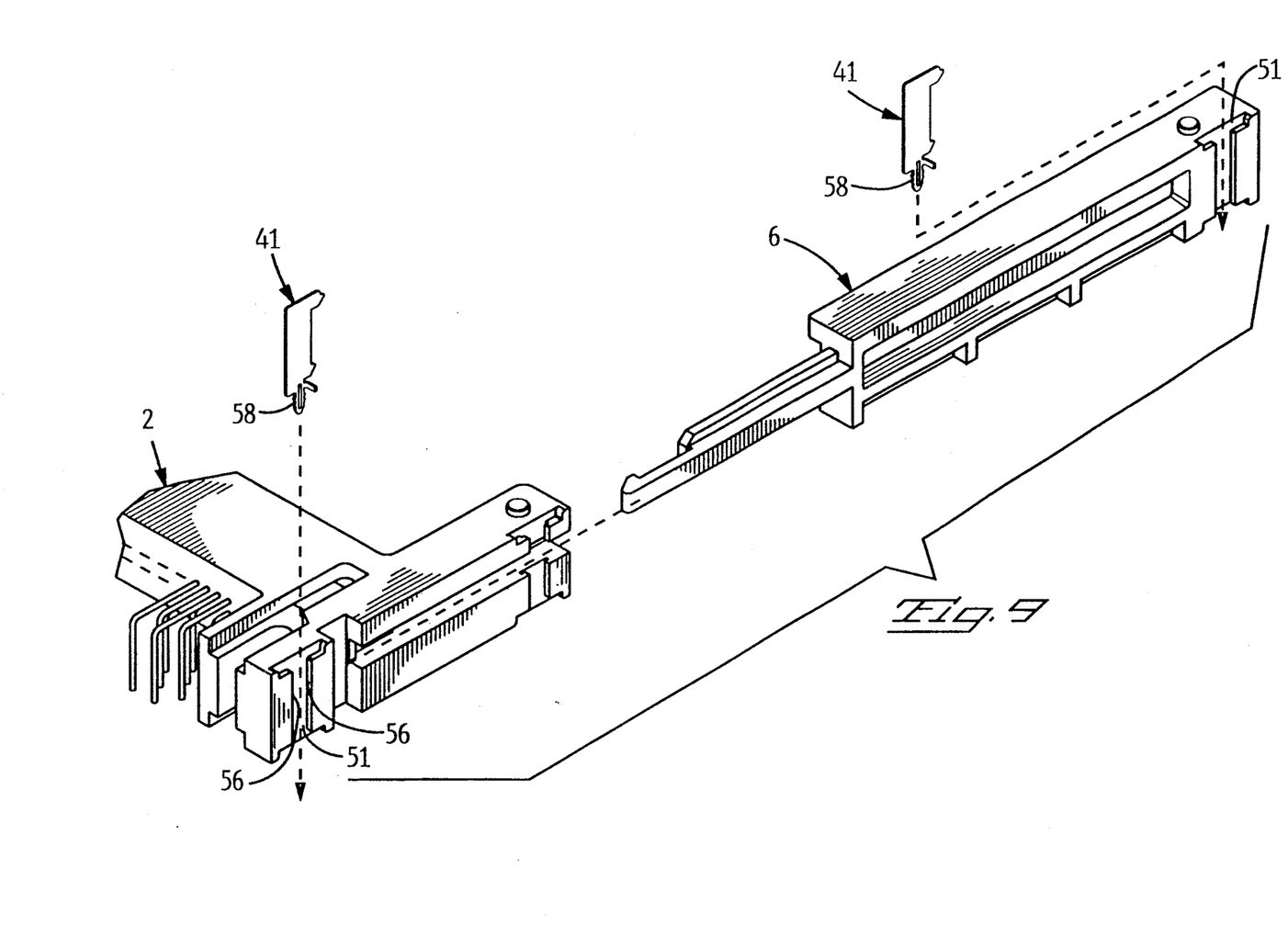
FIG. 9 is a fragmentary perspective view of a taller housing and a set of taller card guide arms, together with taller mounting brackets.
Figure 10:
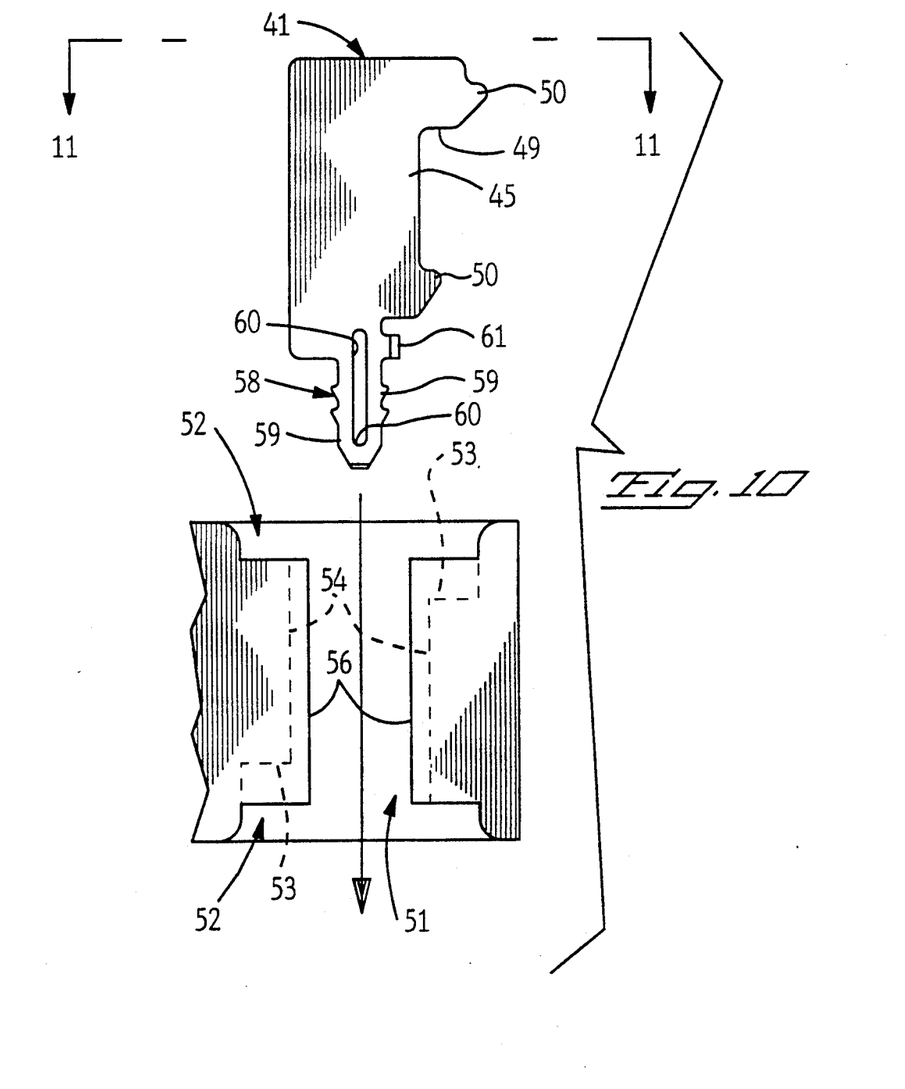
FIGS. 10 and 13 are views similar to FIGS. 7 and 8, and illustrate the mounting bracket of FIG. 5 in the process of connection with a portion of the housing shown in FIG. 1.
Figure 11:
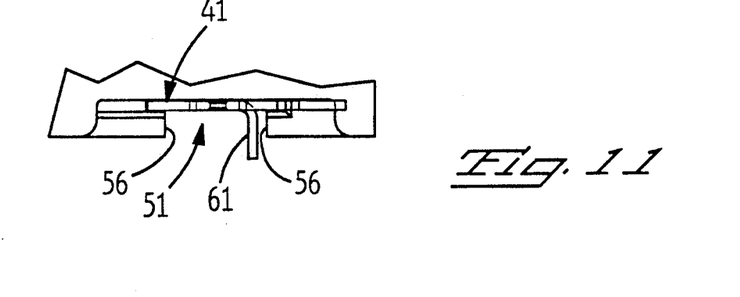
FIGS. 11 and 12 are fragmentary bottom views of the devices shown in FIGS. 10 and 13, respectively.

With reference to FIGS. 3 through 6 and 18, a mounting bracket 41 of varied constructions will be described. The mounting bracket 41 of unitary construction, is stamped and formed from a strip of metal, and comprises, a flat base 42 and at least one arm 45 projecting from the base. A hold down finger 49 extends laterally of the arm 45 in the thickness plane. Also in the thickness plane, a pair of wedge shaped projections 50 are spaced apart along the same arm 45 and extend laterally in the same direction as the hold down finger 49. With reference to FIGS. 3, 4, 5 and 6, one of the projections 50 projects from the finger 49, and one of the projections 50 projects from the arm 45. With reference to FIGS. 4 and 9, both projections 50 project from the arm 45.

With reference to FIGS. 3, 4, 7, 8 and 15, a pair of coplanar arms 44, 45 project from the base 42. The arms 44, 45 are joined by a first bight 46 joined to the base 42 by a thin, strain relieving, web 47 that is bendable when forces are applied to the arms 44, 45 to prevent transfer of the forces to the base 42, and thereby, prevent the forces from dislodging the base 42 from its solder connection. A second bight 48 bridges remote ends of the arms 44, 45.

Figure 15:
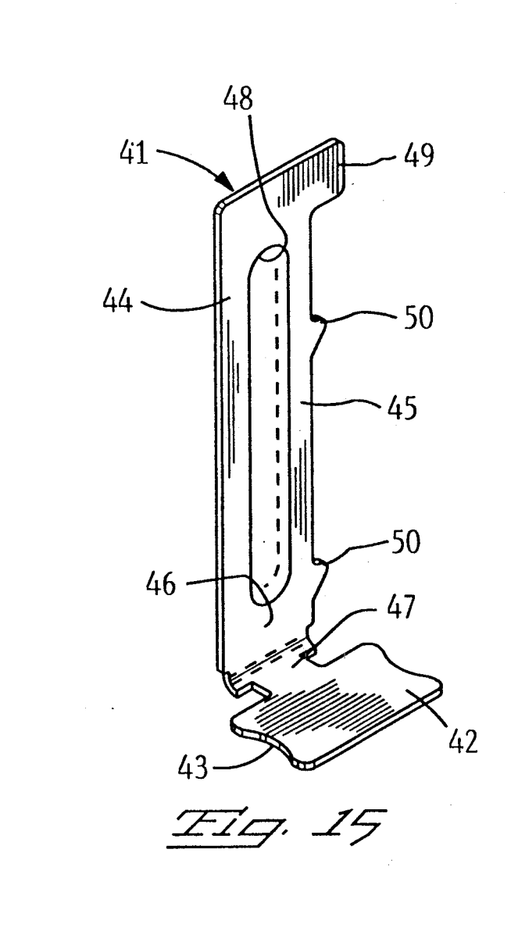
FIG. 15 is an enlarged perspective view of the mounting bracket as shown in FIG. 14.

The base 42 of FIGS. 3, 4 and 15, is bent to extend transverse to the thickness plane of the arms 44, 45. The base 42 of FIGS. 3, 4, 6 and 15, has serpentine shaped edges 43 of serpentine lengths adapted to be wetted by a molten solder, not shown, for solder connection of the base 42 to a conductive pad of the circuit board 9, FIGS. 1, 2 and 8, or the inverted circuit board 9, FIG. 16.

With reference to FIGS. 1, 2, 7, 8, 9, 10, 13, 14 and 16, the mounting bracket 41 is inserted along one of multiple channels 51 recessed in each of the side surfaces 27 of the housing 2. Each of the channels 51 is widened at opposite, open ends 52 to provide recessed ledges 53 in opposite sides 54 of the channel 51, with one of the ledges 53 being inverted. The hold down finger 49 overlaps the ledge 53 to hold the housing 2 against the first circuit board 9. With reference to FIG. 16, the mounting bracket 41 is inverted, such that the hold down finger 49 overlaps the inverted ledge 53 while the base 42 is solder connected to a pad, not shown, on the inverted circuit board 9, and the inverted foot 9 of the stacked housing 2 received in an aperture 40 of the inverted circuit board 9. The projections 50 of the mounting bracket 41 wedge against a side 54 of the channel, and resiliently deflect the arm 45, such that the arms 44, 45 frictionally engage the opposite sides 54 of the channel 51.

A channel 51 of similar construction is recessed in an exterior side 55 of each guide arm 5, 6, FIGS. 1, 2 and 9. Each of the channels 51 in the guide arms 5,6, and in the housings 2, is constructed with the two open ends 52 and the two ledges 53 to receive a mounting bracket 41 in an inverted position for solder connection of the mounting bracket 41 to the inverted circuit board 9, or, alternatively, to receive a mounting bracket 41 in a non-inverted position for solder connection to the first circuit board 9.

With reference to FIGS. 1, 7, 8, 9, 10, 13 and 14, flanges 56 overhang opposite sides 54 of each channel 51, to overlap edges of the arms 44, 45 of a mounting bracket 41 in the channel 51. One set of the flanges 56 on each side 55 of the housing 2 is divided into spaced apart segments 57, FIG. 16. Each of the flanges 56 overlies a portion of the hold down finger 49 and the projections 50 to maintain them in the plane of thickness of the mounting bracket 41.

The base 42 of FIGS. 5, 9, 10 and 13, comprises, a barbed, slotted post 58 defined by two barbed spring members 59 extending along opposite sides of a slot 60 having closed ends that join the spring members 59 together. Further details of the post 58 are disclosed in U.S. Pat. No. 4,907,987. The post 58 is adapted for insertion in an aperture 69 of the circuit board 9, FIG. 13 instead of a pad as in the circuit board of FIGS. 1, 2, 8, 14 and 16.

Figure 12:
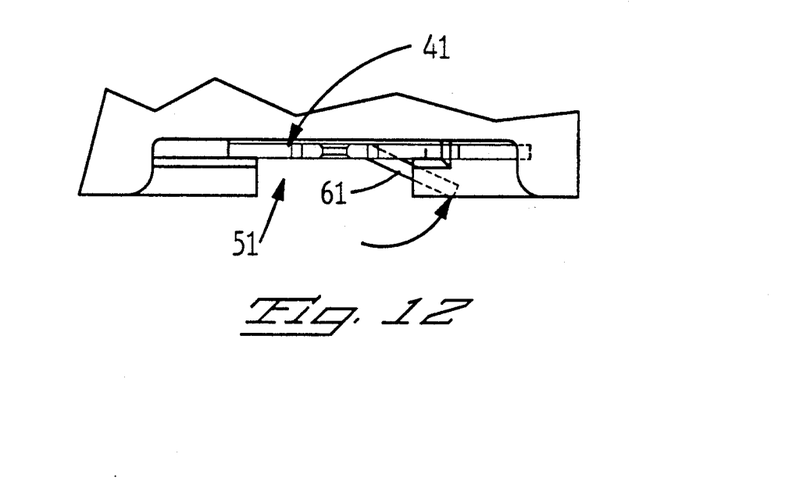
Figure 13:
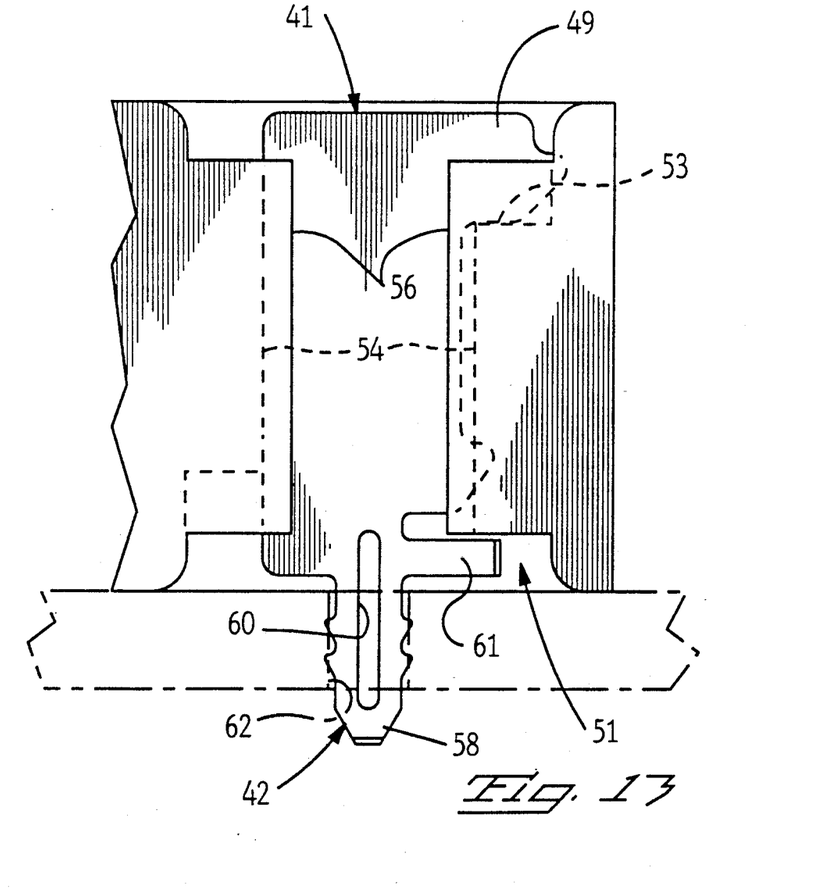

A second finger 61 on the base 42 at an end of the arm 45 remote from the finger 49 is bent out of the plane of the arm 45, FIGS. 5, 6, 10 and 11, to pass between the spaced apart flanges 56, as the base 42 and the arm 45 are inserted along the channel 51. The second finger 61 is thereafter bent to return toward the plane of the arm 45, FIGS. 12 and 13, and to project laterally in the same direction as the finger 49, and to overlap a corresponding, recessed end of the channel 51. The ledge 53 and the recessed end of the channel 51 are interposed between the fingers 49, 61, FIG. 13, thereby to retain the mounting bracket 41.

Other embodiments of the invention and modifications of the invention are intended to be covered by the spirit and scope of the claims defining the invention.

We claim:

1. An electrical connector comprising: a housing; a card receiving mouth in the housing; electrical contacts carried by the housing in the mouth; prong receiving sockets on the housing; guide arms on opposite sides of the mouth; a card receiving groove on each of the guide arms; a prong on each of the guide arms being constructed for locking engagement with the sockets; channels in the housing and the guide arms; a mounting bracket in selected channels, each mounting bracket comprising; spaced arms projecting from a base providing a solder connection to a circuit board, projections on one of the arms, and a hold down finger extending laterally from one of the arms; each mounting bracket being slidable in the selected channel with the projections biasing the arms against opposite sides of the channel, each of the channels being widened at opposite ends to provide a first ledge and a second inverted ledge at the opposite ends, and the hold down finger overlapping a selected one of the first ledge and the inverted ledge to position the base in a first noninverted position or in a second, inverted position.

2. An electrical connector comprising: a housing; a card receiving mouth in the housing; electrical contacts carried by the housing in the mouth; prong receiving sockets on the housing; guide arms on opposite sides of the mouth; a card receiving groove on each of the guide arms; a prong on each of the guide arms being constructed for locking engagement with the sockets; channels in the housing and the guide arms; a mounting bracket in each of selected ones of the channels, each mounting bracket comprising; a base providing a connection to a circuit board, each mounting bracket being slidable in the selected channel; and the guide arms comprise, multiple pairs of guide arms stacked one pair on the other pair, the channels in the stacked guide arms being aligned to receive a single mounting bracket in the aligned channels in the stacked guide arms.

3. An electrical connector as recited in claim 2, and further comprising: projections on the mounting bracket engaging sides of respective aligned channels of the stacked guide arms.

4. An electrical connector comprising:
a housing;
a card receiving mouth in the housing;
electrical contacts carried by the housing in the mouth; prong receiving sockets on the housing;
guide arms on opposite sides of the mouth;
a card receiving groove on each of the guide arms;
a prong on each of the guide arms being constructed for locking engagement with the sockets;
channels in the housing and the guide arms;
a first ledge and an inverted, second ledge at the opposite ends of each of the channels;
a mounting bracket received in respective channels, each mounting bracket comprising; a base providing a connection to a circuit board, and a hold down finger extending laterally;
each mounting bracket being adapted for receipt in one of the channels with the base of the mounting bracket in a noninverted position, and with the hold down finger of the mounting bracket overlapping a first ledge of said one of the channels;
and each mounting bracket being adapted for receipt in one of the channels with the base inverted, and with the hold down finger overlapping the inverted, second ledge of said one of the channels.

5. An electrical connector as recited in claim 4, wherein, the first ledge and the inverted, second ledge of each channel are on opposite sides of said channel.

6. An electrical connector as recited in claim 4, and further comprising: projections on each mounting bracket, and each mounting bracket being received in a channel with each of the projections being biased against a side of the channel.

7. An electrical connector as recited in claim 6, wherein, one of the projections on each mounting brackets projects from the hold down finger on said mounting bracket.

8. An electrical connector as recited in claim 4, and further comprising:
a bendable finger on each mounting bracket adapted to be bent to project laterally and overlap one of opposite ends of a channel.

9. An electrical connector as recited in claim 4, and further comprising:
the guide arms comprise, multiple pairs of guide arms stacked one pair on the other pair, and the channels in the stacked guide arms being aligned to receive a single mounting bracket in the aligned channels in the stacked guide arms.

10. An electrical connector as recited in claim 9, and further comprising: projections on each mounting bracket, and each mounting bracket being received in a channel with each of the projections being biased against a side of the channel.

11. An electrical connector as recited in claim 10, wherein, one of the projections on each mounting bracket projects from the hold down finger on said mounting bracket.

* * * * *

UNITED STATES PATENT AND TRADEMARK OFFICE
CERTIFICATE OF CORRECTION

PATENT NO. : 5,297,966

DATED : March 29, 1994

INVENTOR(S) : Brennian, Jr. et al.

It is certified that error appears in the above-indentified patent and that said Letters Patent is hereby corrected as shown below:

Claim 7, Column 6, Line 11 "brackets" should be --bracket--.

Signed and Sealed this

Twenty-eight Day of March, 1995

Attest:

BRUCE LEHMAN

Attesting Officer   Commissioner of Patents and Trademarks